(12) United States Patent
Yamagami

(10) Patent No.: US 6,346,820 B1
(45) Date of Patent: Feb. 12, 2002

(54) CHARACTERISTICS EVALUATION CIRCUIT FOR SEMICONDUCTOR WAFER AND ITS EVALUATION METHOD

(75) Inventor: Minoru Yamagami, Kanagawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/585,491

(22) Filed: Jun. 1, 2000

(30) Foreign Application Priority Data

Jun. 3, 1999 (JP) .......................................... 11-156740

(51) Int. Cl.$^7$ .............................................. G01R 31/02

(52) U.S. Cl. ..................... 324/763; 324/158.1; 324/765; 324/766; 324/769

(58) Field of Search ................................ 324/763, 765, 324/158.1, 766, 769; 438/14, 18; 257/40, 48; 714/719, 724, 733

(56) References Cited

U.S. PATENT DOCUMENTS

| 5,034,687 | A | * | 7/1991 | Huang |
| 5,896,040 | A | * | 4/1999 | Brannigan |
| 5,994,915 | A | * | 11/1999 | Farnworth |
| 6,225,818 | B1 | * | 5/2001 | Park |

FOREIGN PATENT DOCUMENTS

JP          6-295948         10/1994

* cited by examiner

*Primary Examiner*—Vinh P. Nguyen
*Assistant Examiner*—Trung Nguyen
(74) *Attorney, Agent, or Firm*—Hutchins, Wheeler & Dittmar

(57) ABSTRACT

In a characteristics evaluation circuit incorporated into a semiconductor wafer, a dummy element is connected to at least two pads, and a depletion type MOS transistor is connected between the pads. A fuse is connected to a gate of the depletion type MOS transistor, and a gate voltage control pad is connected to the fuse.

14 Claims, 5 Drawing Sheets

CHARACTERISTICS EVALUATION CIRCUIT FOR SEMICONDUCTOR WAFER AND ITS EVALUATION METHOD

BACKGROUND OF THE INVENTION

1. Field of the Invention

The present invention relates to a characteristics evaluation circuit incorporated into a semiconductor wafer and its evaluation method.

2. Description of the Related Art

In a process for manufacturing a semiconductor wafer, characteristics of semiconductor chips are measured at each step. For example, threshold voltage characteristics of MOS transistors, resistance characteristics of conductive layers, capacitance characteristics of conductive layers and the like are measured to check the manufacturing steps.

In order to measure the above-mentioned characteristics of the semiconductor chips, a characteristics evaluation circuit is incorporated into each of the semiconductor chips, a scribe area between the semiconductor chips or a characteristics evaluation area having the same size as the semiconductor chips.

A prior art characteristics evaluation circuit is constructed by a dummy element associated with at least two pads. This will be explained later in detail.

After the characterisctics of the characteristics evaluation circuit are measured, the characteristics evaluation circuit become unneccessary. If the semiconductor chips or the semiconductor wafer associated with such a characteristics evaluation circuit is shipped, any third party can easily analyse the characteristics of the semiconductor chips by placing probes on the pads of the characteristics evaluation circuit.

In order to destroy or inactivate the characteristics evaluation circuit, a first approach is that fuses are connected to the pads of the dummy element. After the characteristics of the characteristics evaluation circuit are measured, the fuses are melted down by a laser trimming process or the like. This also will be explained later in detail.

In the above-mentioned first approach, however, it is impossible to accurately measure the dummy element due to the presence of resistances by the fuses.

A second approach is to directly destroy the dummy element by applying laser or mechanical stress thereto. This also will be explained later in detail.

In the second approach, however, since the dummy element has various types with different sizes, it is impossible to effectively destroy the dummy element, which also increases the manufacturing cost.

SUMMARY OF THE INVENTION

It is an object of the present invention to provide a characteristics evaluation circuit for a semiconductor wafer, capable of being easily destroyed or inactivated.

Another object is to provide an improved characteristics evaluation method for a semiconductor wafer.

According to the present invention, in a characteristics evaluation circuit incorporated into a semiconductor wafer, a dummy element is connected to at least two pads, and a depletion type MOS transistor is connected between the pads. A fuse is connected to a gate of the depletion type MOS transistor, and a gate voltage control pad is connected to the fuse.

When evaluating the characteristics of the dummy element, an appropriate voltage is applied to the gate voltage control pad so as to turn OFF the depletion type MOS transistor. Then, probes are placed on the pads to measure characteristics of the dummy element. Finally, the fuse is cut.

Note that, when the fuse is cut, the gate of the depletion type MOS transistor is in a floating state. In this state, since the pad is not connected to the gate of the depletion type MOS transistor, the gate of the depletion type MOS transistor is very small. Therefore, since only a small charge is injected into the floating state gate, the gate voltage of the depletion type MOS transistor remains at zero (ground), so that the depletion type MOS transistor is always in an ON state.

BRIEF DESCRIPTION OF THE DRAWINGS

The present invention will be more clearly understood from the description set forth below, as compared with the prior art, with reference to the accompanying drawings, wherein.

DESCRIPTION OF THE PREFERRED EMBODIMENTS

Before the description of the preferred embodiments, prior art semiconductor characteristics evaluation circuits will be explained with reference to FIGS. 1, 2A, 2B, 2C, 3A, 3B, 3C, 4A, 4B and 4C.

Figure 1:
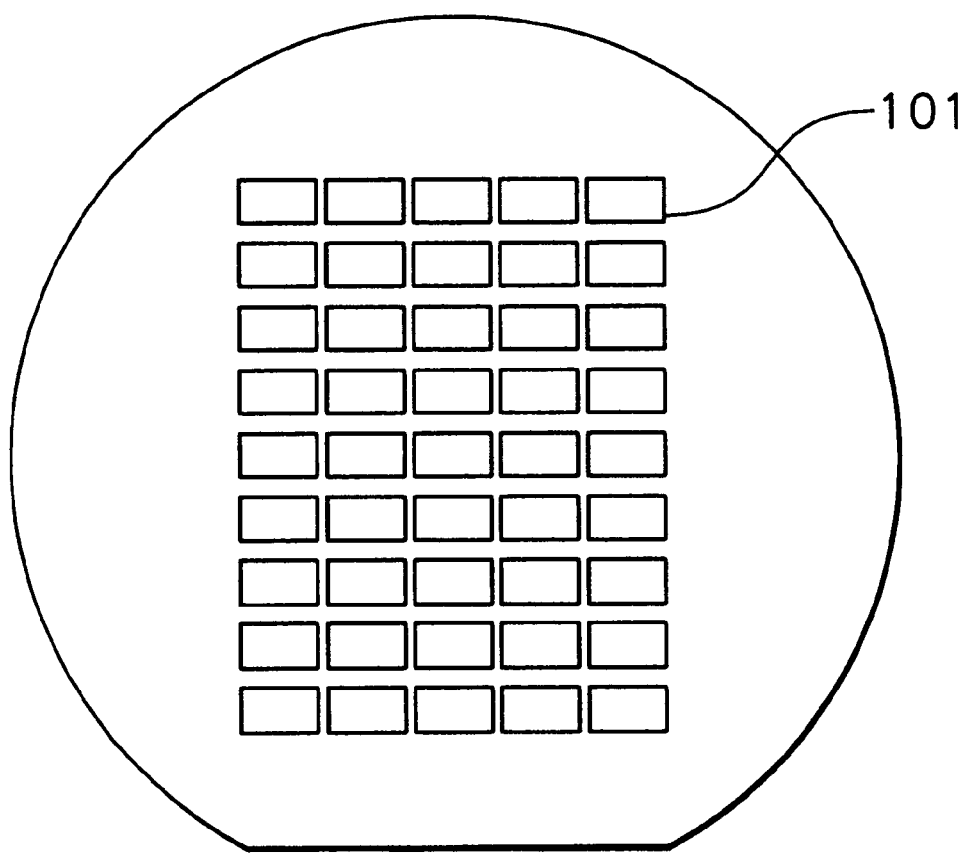
FIG. 1 is a layout diagram illustrating a prior art semiconductor wafer.

In FIG. 1, which is a layout diagram illustrating a prior art semiconductor wafer, semiconductor chips 101 are arranged in rows, columns. The semiconductor chips 101 ale separated from each other, and will be shipped. In order to evaluate the characteristics of the sen miconductorwafer, i.e., the characteristics of the semiconductor chips 101, characteristics evaluation circuits are incorporated into the semiconductor wafer of FIG. 1, as illustrated in FIGS. 2A, 2B and 2C.

Figure 2A:
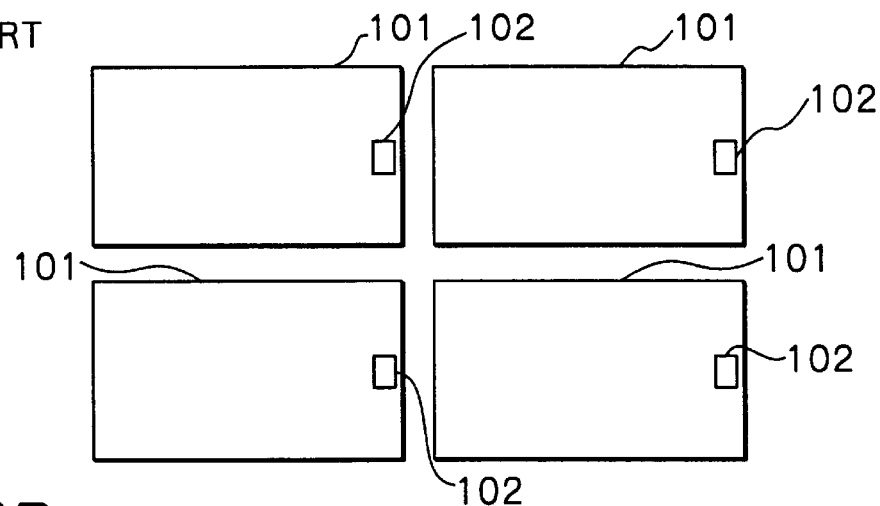
FIGS. 2A, 2B and 2C are layout diagrams for explaining the location of the characteristics evaluation areas of FIG. 1.

In FIG. 2A, one characteristics evaluation area 102 for a semiconductor characteristics evaluation circuits is provided within each of the semiconductor chips 101.

Figure 2B:
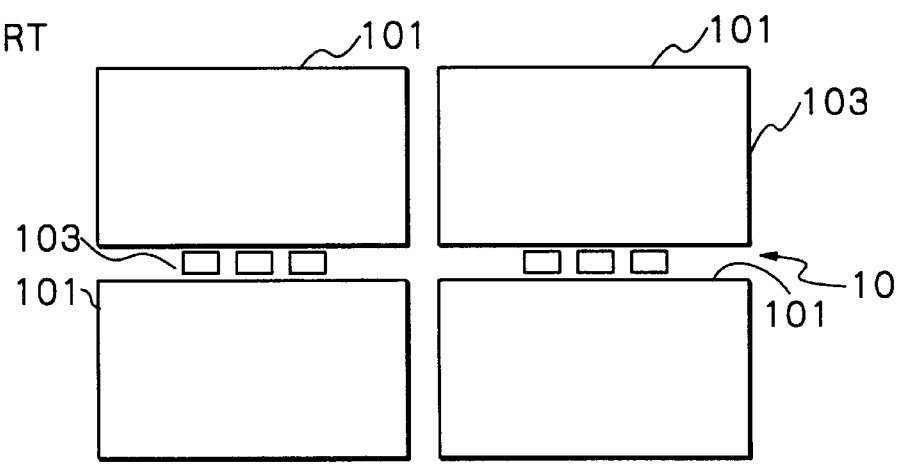

In FIG. 2B, a plurality of characteristics evaluation areas 103 for characteristics evaluation circuits, are provided in scribe areas 104 between the semiconductor chips 101.

Figure 2C:
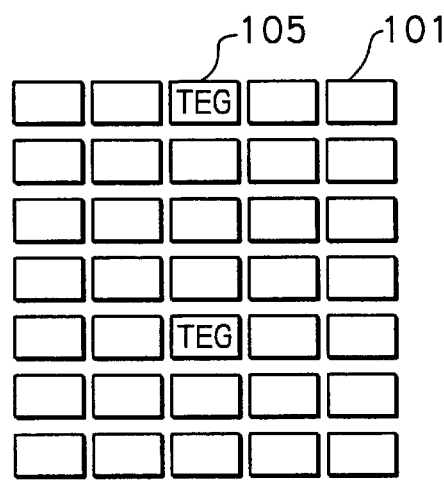

In FIG. 2C, some of the semiconductor chips 101 are replaced by characteristics evaluation areas 105 for characteristics evaluation circuits. In this case, each of the characteristics evaluation areas 105 has the same size as the semiconductor chips 101. Note that the characteristics evaluation areas 105 are called test elementary group (TEG) areas.

Figure 3A:
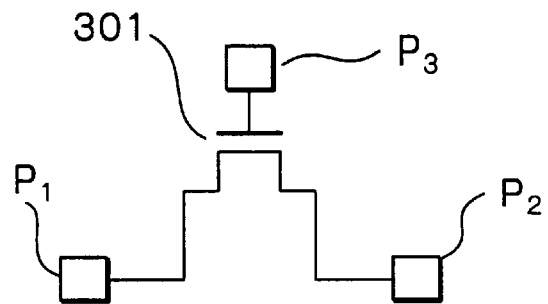
FIGS. 3A, 3B and 3C are circuit diagrams of the characteristics evaluation circuit used in the characteristics evaluation of FIGS, 2A, 2B and 2C.
Figure 3B:
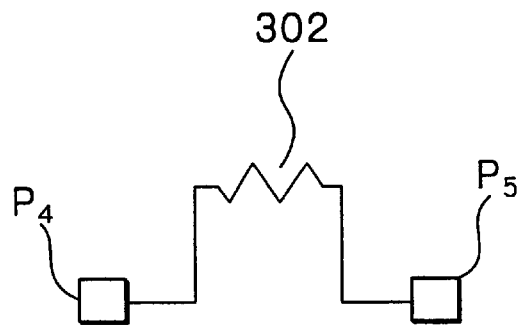
Figure 3C:
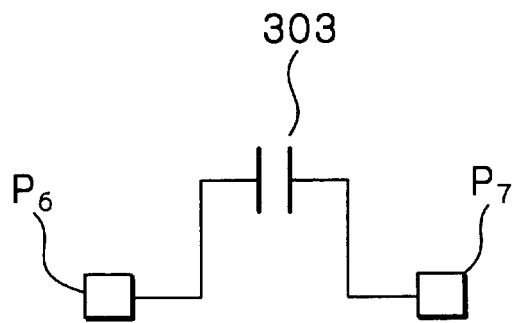

The characteristics evaluation circuit used in the characteristics evaluation areas 102, 103 and 105 of FIGS. 2A, 2B and 2C is illustrated in FIG. 3A, 3B and 3C.

In FIG. 3A, a dummy MOS transistor 301 has a source connected to a pad $P_1$, a drain connected to a pad $P_2$ and a gate connected to a pad $P_3$. Thus, the characteristics of the dummy MOS transistor 301 can be measured by placing probes (not shown) on the pads $P_1$, $P_2$ and $P_3$.

In FIG. 3B, a dummy resistor 302 has a terminal connected to a pad $P_4$ and a terminal connected to a pad $P_5$. Thus, the characteristics of the resistor 302 can be measured by placing probes (not shown) on the pads $P_4$ and $P_5$, In FIG. 3C, a dummy capacitor 303 has a terminal connected to a pad $P_6$ and a terminal connected to a pad $P_7$. Thus, the characteristics of the capacitor 303 can be measured by placing probes (not shown) on the pads $P_6$ and $P_7$ After the characteristics of the characteristics evaluation circuits of FIGS. 3A, 3B and 3C are measured, the characteristics evaluation circuits become unnecessary. If the semiconductor chips 101 associated with such characteristics evaluation circuits are shipped, any third party can easily analyse the characteristics of the semiconductor chips 101 by placing probes on the pads of the characteristics evaluation areas 102, 103 or 105. Therefore, the characteristics evaluation circuits should be destroyed prior to the shipping.

When the characteristics evaluation circuits are provided in the characteristics evaluation areas 102 of FIG. 2A, it is difficult to destroy or inactivate the characteristics evaluation circuits.

On the other hand, when the characteristics evaluation circuits are provided in the characteristics evaluation areas 103 or 105 of FIG. 2B or 2C, it is easy to destroy or inactivate the characteristics evaluation circuits. In this case, however, if a wafer without splitting the semiconductor chips 101 is shipped to another semiconductor manufacturer through an original equipment manufacturing (OEM) system or the like, it is also difficult to destroy or inactivate the characteristics evaluation circuits.

Figure 4A:
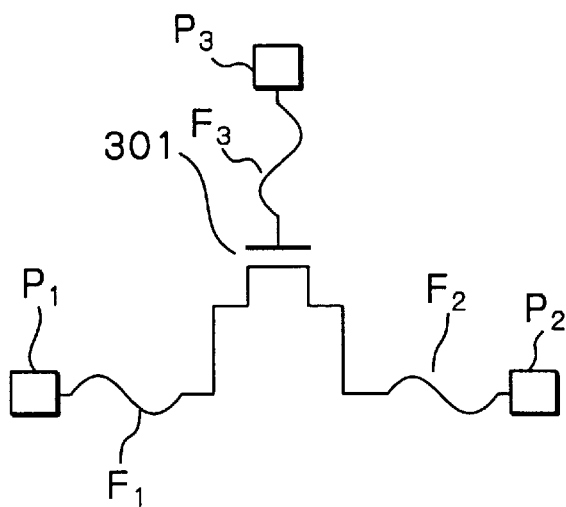
FIGS. 4A, 4B and 4C are also circuit diagrams of the characteristics evaluation circuit used in the characteristics evaluation areas of FIGS, 2A, 2B and 2C.
Figure 4B:
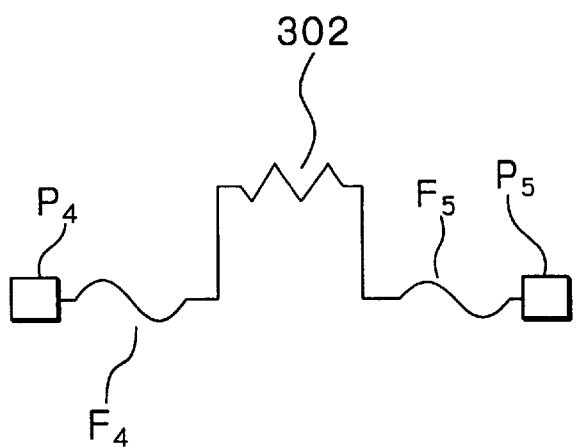
Figure 4C:
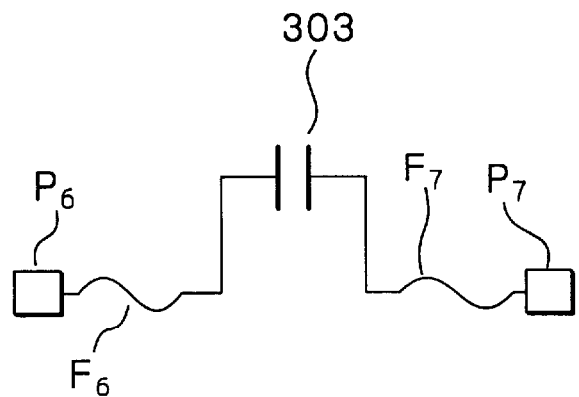

In order to destroy or inactivate the characteristics evaluation circuits of FIGS. 3A, 3B and 3C, a first approach is that fuses $F_1$ through $F_7$ are connected to the pads $P_1$ through $P_7$, respectively, as illustrated in FIGS. 4A, 4B and 4C. After the characteristics of the characteristics evaluation circuits of FIGS. 4A, 4B and 4C are measured, the fuses $F_1$ through $F_7$ are melted down by a laser trimming process or the like.

In the above-mentioned first approach, however, it is impossible to accurately measure the dummy MOS transistor 301, the dummy resistor 302 and the dummy capacitor 303 of FIGS. 4A, 4B and 4C due to the presence of resistances by the fuses $F_1$ through $F_7$ Even if the fuses $F_1$ through $F_7$ are made of aluminum having a low resistance value, the fuses $F_1$ through $F_7$ still have a large resistance when the aluminum is relative slim. If aluminum is widened to decrease its resistance value, it is impossible to melt down the fuses $F_1$ through $F_7$ by one laser trimming process, which increases the manufacturing cost.

A second approach is to directly destroy the dummy MOS transistor 301, the dummy resistor 302 and the dummy capacitor 303 of FIGS. 3A, 3B and 3C by applying laser or mechanical stress thereto.

In the second approach, however, since the dummy MOS transistor 301, the dummy resistor 302 and the capacitor 303 of FIGS. 3A, 3B and 3C have various types with different sizes, it is impossible to effectively destroy the dummy MOS transistor 301, the dummy resistor 302 and the dummy capacitor 303 of FIGS. 3A, 3B and 3C, which also increases the manufacturing cost.

Figure 5A:
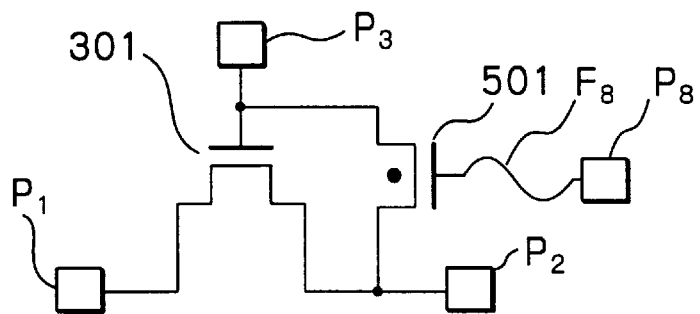
FIG. 5A is a circuit diagram illustrating a first embodiment of the characteristics evaluation circuit according to the present invention.

In FIG. 5A, which illustrates a first embodiment of the present invention, a depletion type MOS transistor 501 is connected between the drain and the gate of the dummy MOS transistor 301 of FIG. 3A. The gate of the depletion type MOS transistor 501 is connected via a fuse $F_8$ to a pad $P_8$. Note that the depletion type MOS transistor 501 can be of a P-channel type or of an N-channel type.

Before the characteristics of the dummy MOS transistor 301 are measured, an appropriate voltage is applied by placing a probe (not shown) on the pad $P_8$ to surely turn OFF the depletion type MOS transistor 501. Then, the characteristics of the dummy MOS transistor 301 are measured by placing probes on the pads $P_1$, $P_2$ and $P_3$.

After the characteristics of the dummy MOS transistor 301 are measured, the fuse $F_8$ is melted down by a laser trimming process or the like. As a result, the depletion type MOS transistor 501 becomes in an ON state, so that the pad $P_2$ is electrically connected to the pad $P_3$, In this state, it is no longer possible for the characteristics of the dummy MOS transistor 301 to be correctly measured.

In FIG. 5A, a depletion type MOS transistor associated with a fuse and a pad can be connected between the source and the gate of the dummy MOS transistor 301 or between the source and the drain of the dummy MOS transistor 301.

Figure 5B:
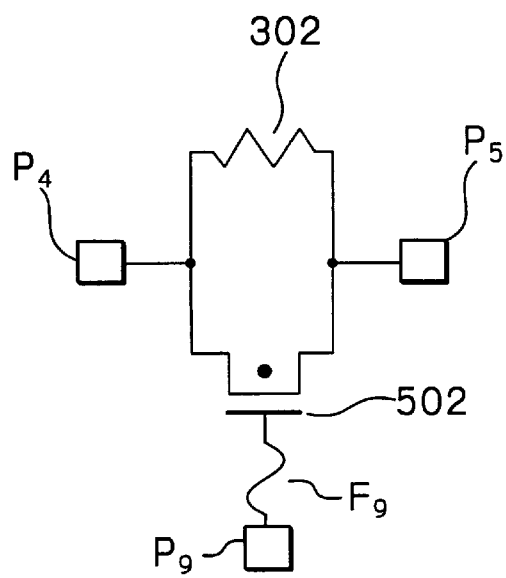
FIG. 5B is a circuit diagram illustrating a second embodiment of the characteristics evaluation circuit according to the present invention.

In FIG. 5B, which illustrates a second embodiment of the present invention, a depletion type MOS transistor 502 is connected between the terminals of the dummy resistor 302 of FIG. 3B. The gate of the depletion type MOS transistor 502 is connected via a fuse $F_9$ to a pad $P_9$. Note that the depletion type MOS transistor 502 can be of a P-channel type or of an N-channel type.

Before the characteristics of the dummy resistor 302 are measured, an appropriate voltage is applied by placing a probe (not shown) on the pad $P_9$ to surely turn OFF the depletion type MOS transistor 502. Then, the characteristics of the dummy resistor 302 are be measured by placing probes on the pads $P_4$ and $P_5$.

After the characteristics of the dummy resistor 302 are measured, the fuse $F_9$ is melted down by a laser trimming process or the like. As a result, the depletion type MOS transistor 502 becomes in an ON state, so that the pad $P_4$ is electrically connected to the pad $P_5$. In this state, it is no longer possible for the characteristics of the dummy resistor 302 to be correctly measured.

Figure 5C:
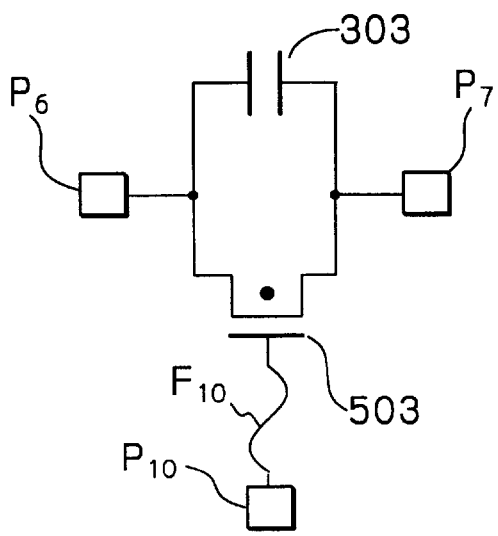
FIG. 5C is a circuit diagram illustrating a third embodiment of the characteristics evaluation circuit according to the present invention.

In FIG. 5C, which illustrates a third embodiment of the present invention, a depletion type MOS transistor 503 is connected between the terminals of the dummy capacitor 303 of FIG. 3C. The gate of the depletion type MOS transistor 503 is connected via a fuse $F_{10}$ to a pad $P_{10}$. Note that the depletion type MOS transistor 503 can be of a P-channel type or of an N-channel type.

Before the characteristics of the dummy capacitor 303 are measured, an appropriate voltage is applied by placing a probe (not shown) on the pad $P_{10}$ to surely turn OFF the depletion type MOS transistor 503. Then, the characteristics of the dummy capacitor 303 are measured by placing probes on the pads $P_6$ and $P_7$.

After the characteristics of the dummy capacitor 303 are measured, the fuse $F_{10}$ is melted down by a laser trimming process or the like. As a result, the depletion type MOS transistor 503 becomes in an ON state, so that the pad $P_6$ is electrically connected to the pad $P_7$ In this state, it is no longer possible for the characteristics of the dummy capacitor 303 to be correctly measured.

In the above-described embodiments, since the fuses $F_8$, $F_9$ and $F_{10}$ do not need to supply currents to the gates of the depletion type MOS transistors 501, 502 and 503, respectively, the fuses $F_8$, $F_9$ and $F_{10}$ can be very slim. As a result, the fuses $F_8$, $F_9$ and $F_{10}$ can be easily melted down by a laser trimming process or the like. Also, the fuses $F_8$, $F_9$ and $F_{10}$ can be made of materials other than aluminum.

Also, in the present invention, other dummy elements than the dummy MOS transistor 301, the dummy resistor 302 and the dummy capacitor 303 can be introduced into the characteristics evaluation circuits.

Further, the characteristics evaluation circuits of FIGS. 5A, 5B and 5C can be incorporated into any of the characteristics evaluation areas of FIGS. 2A, 2B and 2C.

As explained hereinabove, according to the present invention, characteristics evaluation circuits incorporated into a semiconductor wafer can be easily destroyed or inactivated.

What is claimed is:

1. A characteristics evaluation circuit incorporated into a semiconductor wafer, comprising:
    a dummy element connected to at least two pads;
    a depletion type MOS transistor connected between said pads;
    a fuse connected to a gate of said depletion type MOS transistor; and
    a gate voltage control pad connected to said fuse.

2. The characteristics evaluation circuit as set forth in claim 1, wherein said dummy element comprises a MOS transistor.

3. The characteristics evaluation circuit as set forth in claim 1, wherein said dummy element comprises a resistor.

4. The characteristics evaluation circuit as set forth in claim 1, wherein said dummy element comprises a capacitor.

5. The characteristics evaluation circuit as set forth in claim 1, being incorporated into each semiconductor chip of said semiconductor wafer.

6. The characteristics evaluation circuit as set forth in claim 1, being incorporated into a scribe area of said semiconductor wafer.

7. The characteristics evaluation circuit as set forth in claim 1, being incorporated into a characteristics evaluation area having the same size of semiconductor chip of said semiconductor wafer.

8. A method for evaluating a semiconductor characteristics evaluation circuit comprising a dummy element connected to at least two pads, a depletion type MOS transistor connected between said pads, a fuse connected to a gate of said depletion type MOS transistor, and a gate voltage control pad connected to said fuse, said method comprising the steps of:
    applying an appropriate voltage to said gate voltage control pad so as to turn OFF said depletion type MOS transistor;
    placing probes on said pads to measure characteristics of said dummy element after said appropriate voltage is applied to said gate voltage control pad; and
    cutting said fuse after the characteristics of said dummy element are measured.

9. The method as set forth in claim 8, wherein said dummy element comprises a MOS transistor.

10. The method as set forth in claim 8, wherein said dummy element comprises a resistor.

11. The method as set forth in claim 8, wherein said dummy element comprises a capacitor.

12. The method as set forth in claim 8, wherein said characteristics evaluation circuit is incorporated into each semiconductor chip of said semiconductor wafer.

13. The method as set forth in claim 8, wherein said characteristics evaluation circuit is incorporated into a scribe area of said semiconductor wafer.

14. The method as set forth in claim 8, wherein said characteristics evaluation circuit is incorporated into a characteristics evaluation area having the same size of semiconductor chips of said semiconductor wafer.

* * * * *